US010509285B2

(12) United States Patent
Wang

(10) Patent No.: US 10,509,285 B2
(45) Date of Patent: Dec. 17, 2019

(54) METHOD AND SYSTEM FOR REPAIRING SHORT CIRCUIT DEFECT IN DISPLAY PANEL

(71) Applicants: BOE Technology Group Co., Ltd., Beijing (CN); BOE Optical Science and Technology Co., Ltd., Suzhou (CN)

(72) Inventor: Yu Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 83 days.

(21) Appl. No.: 15/742,780

(22) PCT Filed: Apr. 21, 2017

(86) PCT No.: PCT/CN2017/081410
§ 371 (c)(1),
(2) Date: Jan. 8, 2018

(87) PCT Pub. No.: WO2017/215347
PCT Pub. Date: Dec. 21, 2017

(65) Prior Publication Data
US 2018/0203315 A1     Jul. 19, 2018

(30) Foreign Application Priority Data

Jun. 12, 2016 (CN) .......................... 2016 1 0409278

(51) Int. Cl.
*G02F 1/1362* (2006.01)
*G01R 31/44* (2006.01)
(Continued)

(52) U.S. Cl.
CPC ....... *G02F 1/136259* (2013.01); *G01R 31/44* (2013.01); *G02F 1/1303* (2013.01);
(Continued)

(58) Field of Classification Search
CPC .................. G02F 1/136259; G01R 31/021
See application file for complete search history.

(56) References Cited

U.S. PATENT DOCUMENTS

| 9,697,757 B2 | 7/2017 | Ai |
| 2001/0028429 A1 | 10/2001 | Wu |

(Continued)

FOREIGN PATENT DOCUMENTS

| CN | 101799508 A | 8/2010 |
| CN | 102540508 A | 7/2012 |

(Continued)

OTHER PUBLICATIONS

English Translation International Search Report and Written Opinion from International Patent Application No. PCT/CN2017/081410, dated Jul. 21, 2017, 5 pages.

*Primary Examiner* — Daniel Whalen
(74) *Attorney, Agent, or Firm* — Westman, Champlin & Koehler, P.A.

(57) ABSTRACT

The present disclosure provides a method and system for repairing a short circuit defect in a display panel. The method comprises: connecting two terminals of an external repair power supply to a first test point and a second test point respectively, wherein there is a short circuit defect in a line between the first test point and the second test point; and adjusting an input voltage of the external repair power supply to fuse the short circuited line between the first test point and the second test point. With the method for repairing a short circuit defect in a display panel according to the present disclosure, the short circuit defect in the display
(Continued)

panel can be repaired without providing a repair line in the display panel.

14 Claims, 4 Drawing Sheets

(51) Int. Cl.
    *G02F 1/13*           (2006.01)
    *G02F 1/1337*       (2006.01)
    *G02F 1/1368*       (2006.01)
    *H01L 27/12*        (2006.01)

(52) U.S. Cl.
    CPC ........ *G02F 1/1368* (2013.01); *G02F 1/13378* (2013.01); *G02F 1/136286* (2013.01); *H01L 27/1244* (2013.01); *H01L 27/1262* (2013.01); *G02F 2001/136254* (2013.01); *G02F 2001/136263* (2013.01); *G02F 2201/506* (2013.01)

(56) References Cited

U.S. PATENT DOCUMENTS

| | | | |
|---|---|---|---|
| 2007/0273294 A1* | 11/2007 | Nagayama | G09G 3/006 315/169.3 |
| 2011/0159619 A1* | 6/2011 | Tsuji | H01L 27/1225 438/30 |
| 2016/0125776 A1* | 5/2016 | Zhang | G09G 3/006 324/754.08 |
| 2016/0231374 A1 | 8/2016 | Ai | |

FOREIGN PATENT DOCUMENTS

| | | |
|---|---|---|
| CN | 104297622 A | 1/2015 |
| CN | 104635113 A | 5/2015 |
| CN | 105892184 A | 8/2016 |

* cited by examiner

METHOD AND SYSTEM FOR REPAIRING SHORT CIRCUIT DEFECT IN DISPLAY PANEL

CROSS-REFERENCE TO RELATED APPLICATION

The present application is a Section 371 National Stage Application of International Application No. PCT/CN2017/081410, file Apr. 21, 2017, and published as WO 2017/215347 A1, on Dec. 21, 2017, and claims priority to the Chinese Patent Application No. 201610409278.3, filed on Jun. 12, 2016, which are incorporated herein by reference in their entirety.

TECHNICAL FIELD

The present disclosure relates to the field of display technology, and more particularly, to a method and system for repairing a short circuit defect in a display panel.

BACKGROUND

A Thin Film Transistor-Liquid Crystal Display (TFT-LCD for short) comprises a plurality of alternately arranged gate lines and data lines. Each of the gate lines is configured to drive a row of sub-pixels, and each of the data lines is configured to charge a column of sub-pixels. A short circuit defect refers to abnormal display of a display panel that caused by occurrence of short-circuit in a gate line or a data line in the display panel. When a display function of the display panel is under test, test points (for example, a gate line test point, a data line test point and a common electrode test point) reserved in the display panel may be turned on, and it is determined whether there is a short circuit defect in the display panel by observing whether there is a bright spot or a bright line on the display panel.

In the related art, two repair lines (also called rescue lines) may be provided in the display panel in order to quickly and effectively repair the short circuit defect in the display panel. When there is a short circuit defect in a certain line, the line may be cut off at a position where the defect is located using a laser method, and then two terminals of the line are welded to the same repair line respectively, so as to repair the short circuit defect in the display panel.

However, the repair lines provided in the display panel may occupy a wiring space of the display panel and increase the manufacturing cost of the display panel.

SUMMARY

The present disclosure provides a method and system for repairing a short circuit defect in a display panel. The technical solutions are as follows.

In a first aspect, there is provided a method for repairing a short circuit defect in a display panel, comprising:
connecting two terminals of an external repair power supply to a first test point and a second test point respectively, wherein there is a short circuit defect in a line between the first test point and the second test point; and
adjusting an input voltage of the external repair power supply to fuse the short circuited line between the first test point and the second test point.

Alternatively, the first test point comprises a data line test point and/or a gate line test point, and the second test point comprises a common electrode test point.

Alternatively, the step of connecting two terminals of an external repair power supply to a first test point and a second test point respectively comprises:
connecting a positive electrode of the external repair power supply to the first test point, and connecting a negative electrode of the external repair power supply to the second test point.

Alternatively, the step of adjusting an input voltage of the external repair power supply to fuse the short circuited line between the first test point and the second test point comprises:
continuously increasing the input voltage of the external repair power supply, so that display brightness of an area corresponding to the short-circuited line continuously rises; and
when the display brightness of the area stops rising and falls back to be equal to display brightness of other areas, disconnecting the external repair power supply from the display panel.

Alternatively, before the step of connecting two terminals of an external repair power supply to a first test point and a second test point respectively, the method further comprises:
connecting two terminals of a defect detection apparatus to the first test point and the second test point respectively, so as to detect whether there is a short circuit defect in the line between the first test point and the second test point.

Alternatively, the defect detection apparatus comprises an impedance test board and an alarm apparatus electrically connected to the impedance test board. The impedance test board is configured to connect its two terminals to the first test point and the second test point respectively, so as to detect a resistance value between the first test point and the second test point. The impedance test board is further configured to transmit a prompt signal to the alarm apparatus when the resistance value is less than or equal to a preset resistance value; and
the alarm apparatus is configured to generate an alarm signal according to the prompt signal, wherein the alarm signal is used to indicate a short circuit defect in the line between the first test point and the second test point.

Alternatively, the alarm apparatus comprises any of a light-emitting diode, a signal generator and an automated optical inspection.

Alternatively, the method further comprises: connecting the alarm apparatus to a repair line in the display panel; and
when the alarm apparatus transmits an alarm signal, determining that there is static electricity at the end of the repair line.

Alternatively, the method further comprises: placing the repaired display panel in a heating furnace of a preset temperature for a preset time period, so that liquid crystal molecules in the repaired display panel are realigned.

Alternatively, the preset time period is greater than or equal to 1 hour and less than or equal to 2 hours; when no polarizer is disposed in the display panel, the preset temperature is greater than or equal to 120 degrees Celsius and less than or equal to 130 degrees Celsius; and when a polarizer is disposed in the display panel, the preset temperature is greater than or equal to 60 degrees Celsius and less than or equal to 70 degrees Celsius.

In a second aspect, there is provided a system for repairing a short circuit defect in a display panel, comprising:
an external repair power supply having an adjustable voltage, wherein
the external repair power supply is configured to connect its two terminals to a first test point and a second test point of the display panel having the short circuit defect respectively so as to fuse a short circuited line between the first test point and the second test point.

Alternatively, the system further comprises: a defect detection apparatus, wherein the defect detection apparatus is configured to connect its two terminals to the first test point and the second test point in the display panel respectively so as to detect whether there is a short circuit defect in the line between the first test point and the second test point.

Alternatively, the system further comprises: a relay switch, wherein the defect detection apparatus is configured to connect with the external repair power supply in parallel, the parallel connected detect detection apparatus and external repair power supply are then connected in series to the relay switch, and the replay switch is configured to control the defect detection apparatus or the external repair power supply to be connected to the display panel.

The present disclosure provides a method and system for repairing a short circuit defect in a display panel. When there is a short circuit defect in the line between the first test point and the second test point in the display panel, two terminals of the external repair power supply may be connected to the first test point and the second test point respectively, and then the input voltage of the external repair power supply is adjusted to fuse the short circuited line between the two test points to repair the short circuit defect in the display panel. With the method for repairing a short circuit defect, the short circuit defect in the display panel with no repair line can be repaired without providing a repair line in the display panel.

BRIEF DESCRIPTION OF THE DRAWINGS

In order to describe the technical solutions according to the embodiments of the present disclosure more clearly, the accompanying drawings required to be used in the description of the embodiments will be described briefly below. Obviously, the accompanying drawings in the following description are merely some embodiments of the present disclosure, and other accompanying drawings can also be obtained by those of ordinary skill in the art based on these accompanying drawings without contributing any creative work.

FIG. 1-2 is a flowchart of a method for repairing a short circuit defect in a display panel according to an embodiment of the present disclosure;

FIG. 2-1 is a flowchart of another method for repairing a short circuit defect in a display panel according to an embodiment of the present disclosure;

FIG. 2-2 is a diagram of a system for detecting a short circuit defect in a display panel according to an embodiment of the present disclosure;

FIG. 2-3 is a diagram of a short circuit defect in a display panel according to an embodiment of the present disclosure;

FIG. 2-4 is a diagram of a system for repairing a short circuit defect in a display panel according to an embodiment of the present disclosure; and FIG. 3 is a diagram of another system for repairing a short circuit defect in a display panel according to an embodiment of the present disclosure.

DETAILED DESCRIPTION

In order to make the purposes, technical solutions, and advantages of the present disclosure more clear, the embodiments of the present disclosure will be further described in detail below in conjunction with the accompanying drawings.

Figure 1:
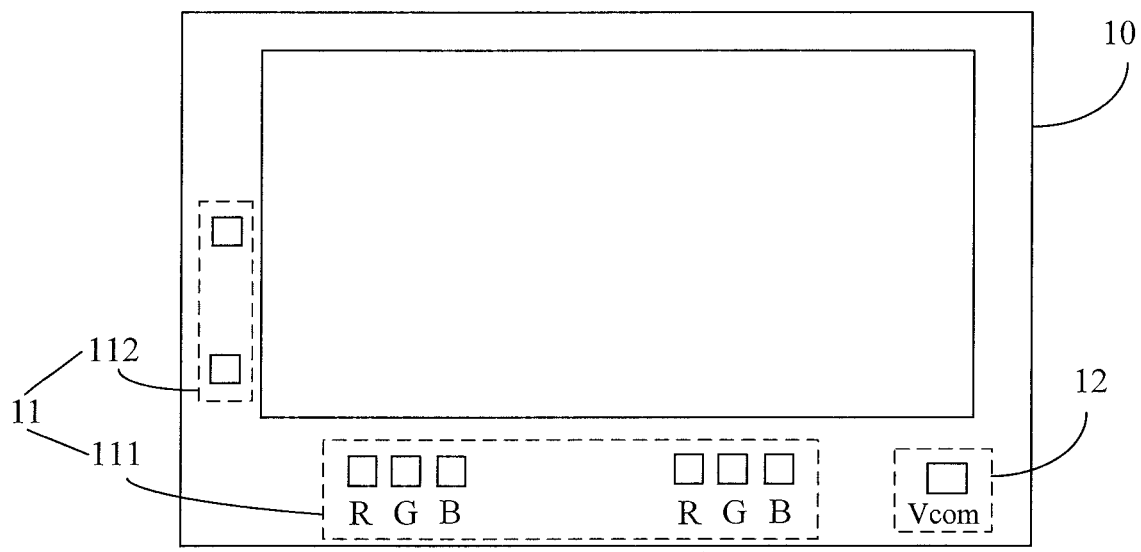
FIG. 1-1 is a structural diagram of a display panel according to an embodiment of the present disclosure.

FIG. 1-1 is a structural diagram of a display panel according to an embodiment of the present disclosure. As shown in FIG. 1-1, a first test point 11 and a second test point 12 may be provided in a bare die 10 (also referred to as a cell bare die) of the display panel which has not been packaged with a printed circuit board or a flexible circuit board. The first test point 11 may comprise a data line test point 111 or a gate line test point 112. The second test point 12 may comprise a common electrode test point. As shown in FIG. 1-1, when the first test point 11 is a data line test point, the data line test point 111 may comprise at least one group of sub-pixel test points, wherein each of the sub-pixel test points is connected to all data lines in the display panel for driving sub-pixels of the same color as itself; and when the first test point 11 is a gate line test point, the gate line test point 112 may be correspondingly connected to any gate line in a display apparatus respectively. The second test point 12 may be connected to a common electrode of any sub-pixel in the display panel. As an example, in the display panel illustrated in FIG. 1-1, the data line test point 111 comprises two groups of sub-pixel test points. Each group of sub-pixel test points comprises three sub-pixel test points, for example, a red sub-pixel test point R, a green sub-pixel test point G and a blue sub-pixel test point B, wherein the red sub-pixel test point R may be connected to all the data lines in the display panel for driving red sub-pixels. With method for repairing a short circuit defect in a display panel according to various embodiments of the present disclosure, the short circuit defect in the display panel can be detected and repaired by using the first test point 11 and the second test point 12 in the display panel.

Figures 1, 2:
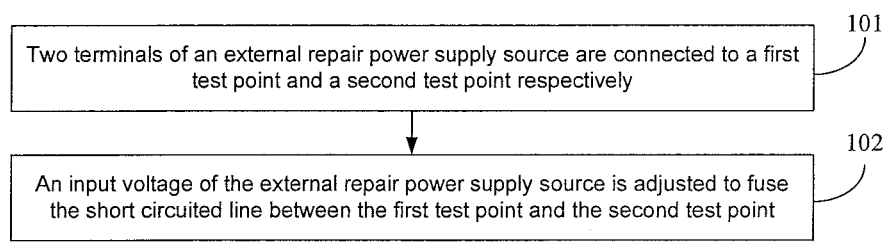

FIG. 1-2 is a flowchart of a method for repairing a short circuit defect in a display panel according to an embodiment of the present disclosure. The method may be used to repair the display panel illustrated in FIG. 1-1. As shown in FIG. 1-2, the method may comprise the following steps.

In step 101, two terminals of an external repair power supply are connected to a first test point and a second test point respectively, wherein there is a short circuit defect in a line between the first test point and the second test point.

In step 102, an input voltage of the external repair power supply is adjusted to fuse the short circuited line between the first test point and the second test point, so as to repair the short circuit defect in the display panel.

In summary, with the method for repairing a short circuit defect in a display panel according to the embodiments of the present disclosure, the input voltage of the external repair power supply can be adjusted to fuse the short circuited line between the first test point and the second test point in the display panel, so as to achieve the purpose of repairing the short circuit defect in the display panel. With the method for repairing a short circuit defect, the short circuit defect in the display panel with no repair line can be repaired without providing a repair line in the display panel.

FIG. 2-1 is a flowchart of a method for repairing a short circuit defect in a display panel according to an embodiment of the present disclosure. The method may be used to repair the display panel illustrated in FIG. 1-1. As shown in FIG. 2-1, the method may comprise the following steps.

In step 201, two terminals of a defect detection apparatus are connected to a first test point and a second test point in the display panel respectively.

In the embodiment of the present disclosure, the defect detection apparatus is configured to detect whether there is a short circuit defect in a line between the first test point and the second test point in the display panel. FIG. 2-2 is a structural diagram of a system for detecting a short circuit defect in a display panel according to an embodiment of the present disclosure. As shown in FIG. 2-2, the defect detection apparatus 20 may comprise an impedance test board 21 and an alarm apparatus 21 which is electrically connected to the impedance test board 21. Two terminals of the impedance test board 21 may be connected to a first test point 11 and a second test point 12 respectively. The first test point 11 may be a gate line test point or a data line test point, and the second test point 12 may be a common electrode test point. Alternatively, the two terminals of the impedance test board 21 may be electrically connected to the gate line test point and the data line test point of the display panel 10 respectively. The impedance test board 21 may detect a resistance value between the two test points (for example, the first test point 11 and the second test point 12, or the gate line test point and the data line test point). When the resistance value is less than or equal to a preset resistance value, the impedance test board 21 may transmit a prompt signal to the alarm apparatus 22, and the alarm apparatus 22 is configured to generate an alarm signal according to the prompt signal. The alarm signal is used to indicate a short circuit defect in the line between the two test points in the display panel, that is, there is a short circuit defect in the display panel.

Figures 1, 2:
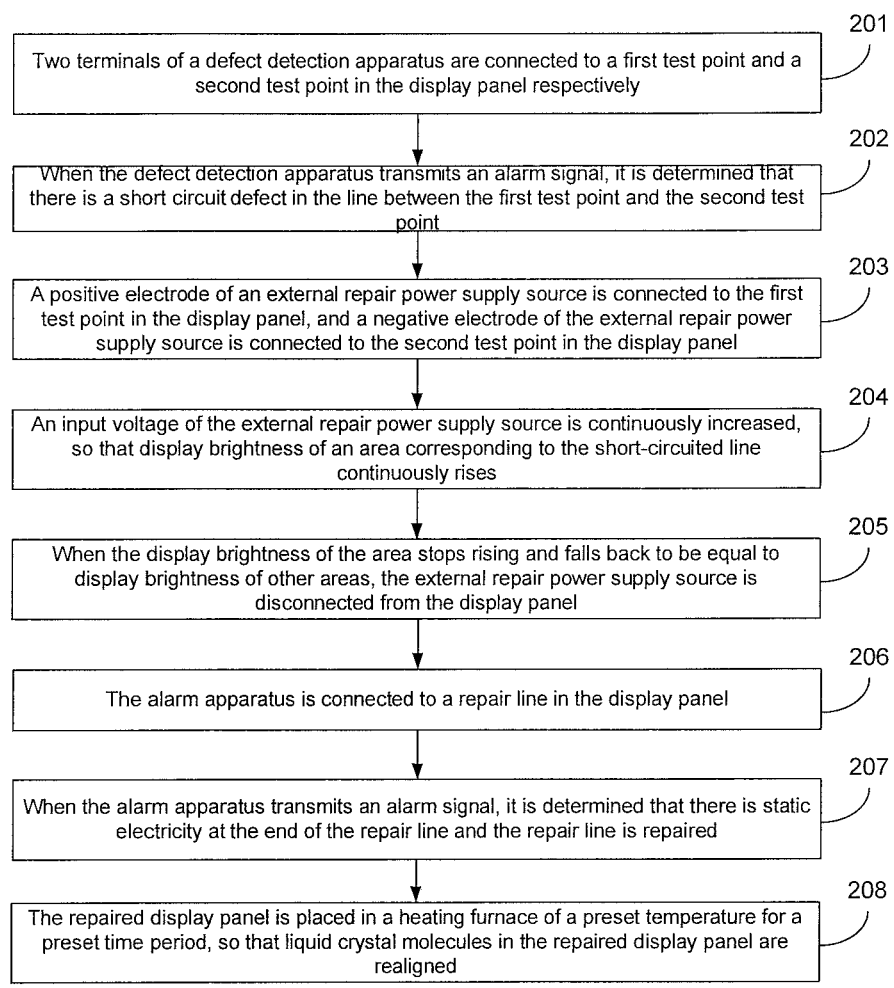
Figure 2:
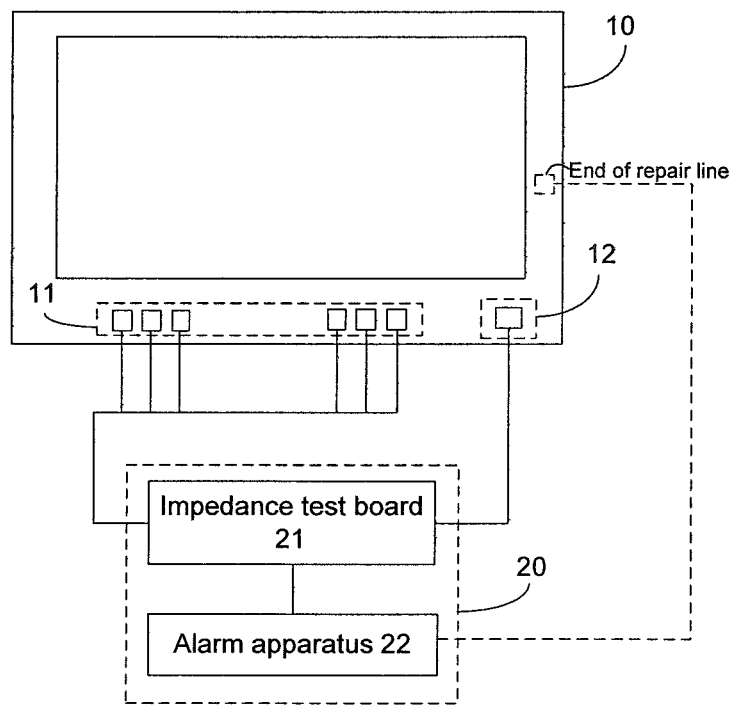
Figures 2, 3:
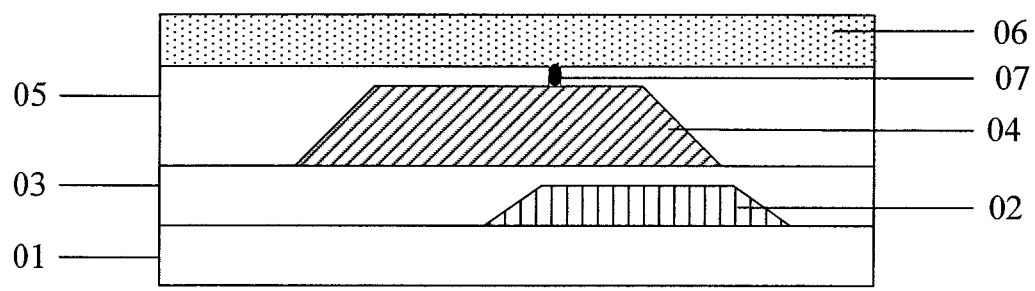

FIG. 2-3 is a structural diagram of a short circuit defect in a display panel according to an embodiment of the present disclosure. As shown in FIG. 2-3, in Advanced-Super Dimensional Switching (ADS for short) type and In Plane Switch (IPS for short) type display apparatuses, a common electrode and a pixel electrode are both disposed on an array substrate. As shown in FIG. 2-3, the array substrate in the display panel may comprise a glass substrate 01, a gate electrode 02, a first insulating layer 03, a source electrode (i.e., a data line) 04, a second insulating layer 05 and a common electrode 06, wherein the source electrode 04 overlaps with the common electrode 06 in a vertical direction, and the gate electrode 02 also overlaps with the common electrodes 06 in the vertical direction, which may easily result in short circuit at positions where overlapping occurs. When the second insulating layer is broken as particles 07 fall therein, short circuit may occur between the source electrode 04 and the common electrode 06, or when both of the first insulating layer 03 and the second insulating layer 05 are broken as foreign substances fall therein, short circuit may also occur between the gate electrode 02 and the common electrode 06. For example, in a process of packaging the display panel with silver paste, particles of the silver paste may fall into the second insulating layer, which results in short circuit between the source electrode and the common electrode. Alternatively, when the second insulating layer is broken due to other reasons and has loopholes formed therein, due to a small thickness of the second insulating layer, short circuit may also occur between the source electrode 04 and the common electrode 06 due to contact therebetween. The short circuit between the source electrode and the common electrode and the short circuit between the gate electrode and the common electrode may also be referred to as VCOM Short. In an Advanced Hyper Viewing Angle (AHVA for short) type display panel, as the AHVA display panel comprises two common electrode layers and each of the common electrode layers has a smaller thickness, it is easier for VCOM Short to occur.

In general, when there is VCOM Short in the display panel, a resistance value between the first test point and the second test point is generally within 20 kΩ. In the embodiment of the present disclosure, in order to ensure the accuracy of detection, the preset resistance value in the impedance test board may be less than or equal to 15KΩ. As an example, assuming that the preset resistance value in the impedance test board is 15KΩ, when the impedance test board 21 detects that the resistance value between the first test point 11 and the second test point 12 is less than or equal to 15KΩ, the impedance test board 21 may determine that there is a short circuit defect in the display panel 10 and transmit a prompt signal to the alarm apparatus 22.

In step 202, when the defect detection apparatus transmits an alarm signal, it is determined that there is a short circuit defect in the line between the first test point and the second test point.

In the embodiment of the present disclosure, the alarm apparatus 22 may comprise any of a Light-Emitting Diode (LED for short), a signal generator, and an Automated Optical Inspection (AOI for short). When the alarm apparatus 22 is an LED lamp, the alarm signal may be an optical signal, that is, when the resistance value detected by the impedance test board is less than the preset resistance value, the LED may be turned on. When the alarm apparatus 22 is a signal generator (for example, a buzzer), the alarm signal may be an acoustic signal. When the alarm apparatus 22 is an AOI, the alarm signal may be an image signal, that is, the AOI may display a defect image in the display panel.

It should be illustrated that in the embodiment of the present disclosure, as in the method for repairing a short circuit defect, a voltage between the two test points is increased to fuse the short circuited line between the two test points, there is no need to determine a specific position of the short circuit defect in the display panel in the method for repairing a short circuit defect. That is, when the short circuit defect in the display panel is detected by the defect detection apparatus, it only needs to determine whether there is a short circuit defect in the line between the two test points of the display panel without determining a specific line where the short circuit defect occurs. Therefore, the method for repairing a short circuit defect has high repair efficiency.

It should also be illustrated that in the embodiment of the present disclosure, as each test point in the display panel is also connected to a corresponding line in a peripheral area of the display panel, for example, the data line test point is correspondingly connected to a data line in the peripheral area and the gate line test point is correspondingly connected to a gate line in the peripheral area, with the method for repairing a short circuit defect in a display panel according to the embodiments of the present disclosure, not only a short circuit defect in a display area of the display panel can be detected and repaired, but also a short circuit defect in the peripheral area of the display panel can be detected and repaired.

In step 203, a positive electrode of an external repair power supply is connected to the first test point in the display panel, and a negative electrode of the external repair power supply is connected to the second test point in the display panel.

Figures 2, 3, 4:
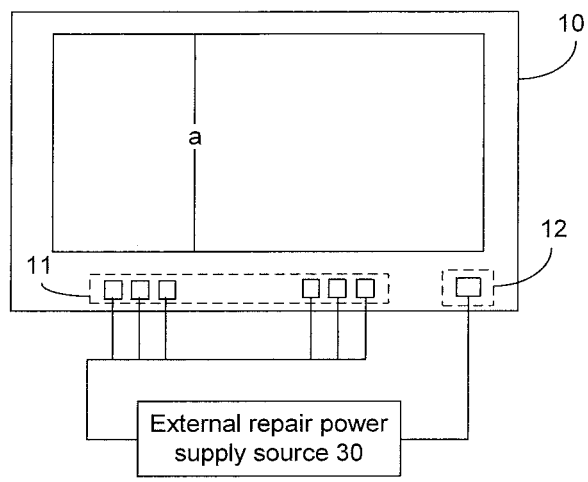
Figure 3:
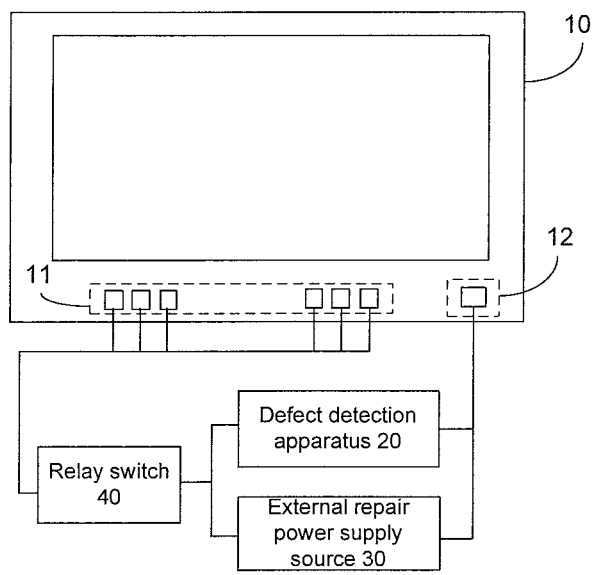

After it is determined that there is a short circuit defect in the display panel according to the alarm signal transmitted by the defect detection apparatus, an operator may connect two terminals of the external repair power supply 30 to the first test point 11 and the second test point 12 in the display panel respectively in a manner illustrated in FIGS. 2-4.

In step 204, an input voltage of the external repair power supply is continuously increased, so that display brightness of an abnormal area corresponding to the short-circuited line continuously rises.

As there is a short circuit defect in the display panel, after the external repair power supply is connected to the display panel, since a resistance value of the short-circuited line is small, and current flowing through the line with a low resistance value is large under certain voltage value, display brightness of an area on the display panel corresponding to the short-circuited line is high (that is, the display brightness is abnormal). When the abnormal area with the abnormal display brightness appears, the input voltage of the external repair power supply may be continuously increased to increase the current flowing through the short-circuited line, so that the display brightness of the abnormal area continuously rises. In this case, a temperature of the short-circuited line may also continuously rise. As an example, when a bright line a appears in the display panel 10 illustrated in FIGS. 2-4, an operator may continuously increase an input voltage of the external repair power supply 30, so that display brightness of the bright line a continuously rises.

It should be illustrated that the defect detection apparatus according to the embodiments of the present disclosure may detect a short circuit defect between any two of the gate line test point, the data line test point and the common electrode test point. With the method for repairing a short circuit defect according to the embodiments of the present disclosure, not only a short circuit defect between the data line test point and the common electrode test point and a short circuit defect between the gate line test point and the common electrode test point can be repaired, but also other types of short circuit defects can be repaired, which will not be repeated here.

In step 205, when the display brightness of the abnormal area stops rising and falls back to be equal to display brightness of other areas, the external repair power supply is disconnected from the display panel.

As the input voltage of the external repair power supply continuously increases, the current flowing through the short-circuited data line in the display panel also continuously increases. When the short circuit defect is caused by conductive particles (such as particles of silver paste), resistance of the conductive particles is generally greater than resistance of the common electrode, and the resistance of the common electrode is greater than resistance of the source electrode or the gate electrode. It can be known according to Joule's law (i.e., heat generated by current flowing through a conductor is proportional to the square of the current and is proportional to resistance of the conductor) that as the input voltage increases, the heat generated by the current flowing through the conductive particles is high, and when the heat in the conductive particles is accumulated to a certain value, the conductive particles may be fused at a high temperature, which results in that the source electrode and the common electrode are disconnected or the gate electrode and the common electrode are disconnected, so that the short circuit defect in the display panel is repaired; and when the short circuit defect is caused by contact between the source electrode and the common electrode due to loopholes formed by breakage of the second insulating layer, large current flows through the source electrode and the common electrode which are short circuited, which may also enable a connection between the source electrode and the common electrode to be fused at a position where the source electrode contacts with the common electrode, so that the short circuit defect is repaired. As current flowing through various data lines (or gate lines) is the same after the short-circuited line between the two test points is fused at a position where the short circuit occurs, display brightness of various areas of the display panel is equal at this time, and an operator may confirm that the short circuit defect has been repaired and therefore the external repair power supply may be disconnected from the display panel. As an example, the external repair power supply 30 may be disconnected from the display panel 10 when the display brightness of the bright line a stops rising and falls back to the same brightness as display brightness of other areas.

In practical applications, due to different causes of short circuit defects, impedance of lines which are short circuited between the first test point and the second test point may also be different (in general, when short circuit occurs, impedance between the source electrode and the common electrode will be less than or equal to 12KΩ). Therefore, input voltages required to repair the short circuit defects may also be different. As a result, the input voltage may be gradually adjusted from small to large until the short circuit defect disappears. Generally, when the input voltage of the external repair power supply is 30 volts (V), a repair success rate for the short circuit defect using the repair method according to the embodiments of the present disclosure is 30%; when the input voltage of the external repair power supply is 60V, the repair success rate is 60%; and when the input voltage of the external repair power supply is 120V, the repair success rate can reach more than 75%.

In the related art, when there is a short circuit defect in a display panel with no repair line, a specific position of the short circuit defect needs to be located and then a line having the short circuit defect is cut off using a laser method at the position where short circuit occurs. If the display panel still cannot display normally after the line is cut off, the display panel cannot be repaired for a second time. For a series of wide viewing angle products, in a process of repairing the short circuit defect using a laser, it may easily lead to secondary short circuit (in the series of wide viewing angle products, an array substrate is provided with two conductive Indium Tin oxide (ITO) layers to form an electric field, gaps between a data line and the two ITO layers are generally from 1.5 μm to 2.0 μm, and generally an energy width of the laser is more than 2.0 μm), and there may be laser debris in the display panel which has been repaired using the laser method, which may have an impact on the quality of the display panel. However, with the method for repairing a short circuit defect according to the embodiments of the present disclosure, the short circuit defect in the display panel is fused at a high voltage. In this method, there is no need to provide a repair line in the display panel and determine the specific location of the short circuit defect in the display panel. Further, this repair process will not cause secondary short circuit in the display panel. Therefore, the method according to the present disclosure not only improves the repair efficiency during the repair process of the short circuit defect, but also breaks technology prejudice that the short circuit defect in the display panel with no repair line cannot be repaired. With the method, the repair success rate of the short circuit defect in the display panel increases from the original 45% to more than 75%.

It should be illustrated that in practical applications, when the source electrode is also fused during the process of fusing the line between the source electrode and the common electrode at the position where short circuit occurs which results in that the data line is disconnected, if there is a repair line provided in the display panel, the two terminals of the disconnected data line may be connected to the repair line respectively, so that the short circuit defect can be repaired.

In step 206, the alarm apparatus is connected to a repair line in the display panel.

In the embodiment of the present disclosure, for a display panel provided with a repair line, the alarm apparatus may further be used to detect whether there is Electro-Static Discharge (ESD for short) at the end of the repair line in the display panel. Specifically, one terminal of the alarm apparatus may be connected to the end of the repair line, and the other terminal of the alarm apparatus may be connected to the ground, so that the repair line and the alarm apparatus form a circuit loop. For a display panel provided with multiple repair lines, one terminal of the alarm apparatus may be connected to the multiple repair lines at the same time.

In step 207, when the alarm apparatus transmits an alarm signal, it is determined that there is static electricity at the end of the repair line and the repair line is repaired.

If there is static electricity in the repair line, after the alarm apparatus is connected to the repair line, there may be current flowing through the alarm apparatus. At this time, the alarm apparatus may transmit an alarm signal for prompting that there is static electricity at the end of the repair line. As an example, when the alarm apparatus is an LED lamp, the alarm signal may be an optical signal; and when the alarm apparatus is a signal generator such as a buzzer, the alarm signal may be an acoustic signal. An operator may determine that there is static electricity at the end of the repair line according to the alarm signal and may perform corresponding repair operations, for example, an operation of repairing a repair line with static electricity using a nano-laser.

In step 208, the repaired display panel is placed in a heating furnace of a preset temperature for a preset time period, so that liquid crystal molecules in the repaired display panel are realigned.

After the short circuit defect in the display panel is repaired in a high-temperature fusion manner, the liquid crystal molecules in the display panel may be disordered and thereby an abnormal screen may appear on the display panel. In order to realign the liquid crystal molecules in the repaired display panel, the repaired display panel may be placed in a heating furnace of a preset temperature for a preset time period.

The preset time period may be greater than or equal to 1 hour and less than or equal to 2 hours. When no polarizer is disposed in the display panel, the preset temperature may be greater than or equal to 120 degrees Celsius and less than or equal to 130 degrees Celsius. For example, the preset temperature may be 125 degrees Celsius. When a polarizer is disposed in the display panel, the predetermined temperature may be greater than or equal to 60 degrees Celsius and less than or equal to 70 degrees Celsius in order to avoid the high temperature from damaging the polarizer.

It should be illustrated that the method for repairing a short circuit defect in a display panel according to the embodiments of the present disclosure can not only repair a bare die of the display panel, but also can repair a semi-finished die set or a finished die set of the display panel. In addition, with respect to a finished die set, when a display screen of the finished die set is abnormal, a cause of the abnormal display in the finished die set of the display panel is judged by the defect detection apparatus 20 in the connection manner shown in FIG. 2-2. When the defect detection apparatus transmits an alarm signal, it may be determined that the abnormal display is caused by a short circuit defect in the display panel; and when the defect detection apparatus does not transmit an alarm signal, it may be determined that the abnormal display is caused by other defects.

It should also be illustrated that the method for repairing a short circuit defect in a display panel according to the embodiments of the present disclosure may be applied to a display panel provided with a repair line in addition to a display panel with no repair line, which is not limited by the embodiments of the present disclosure.

It should also be illustrated that an order of steps of the method for repairing a short circuit defect in a display panel according to the embodiments of the present disclosure may be appropriately adjusted, and some of the steps may also be added or deleted according to situations. For example, steps 206 and 207 may be deleted, and may also be performed after step 208 or before step 201. Any method which can be easily reached by those skilled in the art within the technical scope disclosed in the present disclosure should be included within the protection scope of the present disclosure, and will not be described herein in detail again.

In summary, with the method for repairing a short circuit defect in a display panel according to the embodiments of the present disclosure, the input voltage of the external repair power supply can be adjusted to fuse the short circuited line in the display panel, so as to achieve the purpose of repairing the short circuit defect in the display panel. With the method for repairing a short circuit defect, the short circuit defect in the display panel with no repair line can be repaired without providing a repair line in the display panel.

The embodiments of the present disclosure further provide a system for repairing a short circuit defect in a display panel. As shown in FIG. 2-4, the system may comprise:

an external repair power supply 30 having an adjustable voltage.

The external repair power supply 30 is configured to connect its two terminals to a first test point 11 and a second test point 12 of the display panel 10 having a short circuit defect respectively so as to fuse a short circuited line between the first test point 11 and the second test point 12.

Alternatively, as shown in FIG. 2-2, the system may further comprise a defect detection apparatus 20.

The defect detection apparatus 20 is configured to connect its two terminals to the first test point 11 and the second test point 12 in the display panel 10 so as to detect whether there is a short circuit defect in the line between the first test point 11 and the second test point 12.

Alternatively, as shown in FIG. 3, the system further comprises a relay switch 40.

The defect detection apparatus 20 is connected in parallel to the external repair power supply 30, and the detect detection apparatus 20 and the external repair power supply 30 which are connected in parallel are connected in series to the relay switch 40, and the replay switch 40 is configured to control the defect detection apparatus 20 to be connected to the display panel 10 or the external repair power supply 30 to be connected to the display panel 10. With the relay switch, the display panel can be quickly connected to the external repair power supply or the defect detection apparatus, thereby improving the efficiency of detecting and repairing the display panel, and it is more flexible to use the system for repairing a short circuit defect in a display panel.

In summary, the embodiments of the present disclosure provide a system for repairing a short circuit defect in a display panel. The input voltage of the external repair power supply is adjusted to fuse the short circuited line in the display panel, so as to achieve the purpose of repairing the short circuit defect in the display panel. When the display panel is repaired using the system for repairing a short circuit defect, the short circuit defect in the display panel with no repair line can be repaired without providing a repair line in the display panel.

The above description is merely preferred embodiments of the present disclosure and is not intended to limit the present disclosure. Any modifications, equivalent substitutions, improvements, etc. which are made within the spirit and principle of the disclosure should be included within the protection scope of the present disclosure.

I claim:

1. A method for repairing a short circuit defect in a display panel, comprising:
   connecting two terminals of an external repair power supply to a first test point and a second test point, respectively, wherein there is the short circuit defect in a line between the first test point and the second test point; and
   adjusting an input voltage of the external repair power supply to fuse the short circuited line between the first test point and the second test point,
   wherein the first test point comprises one of a data line test point or a gate line test point, and the second test point comprises a common electrode test point,
   wherein a positive electrode of the external repair power supply is connected to the first test point, and a negative electrode of the external repair power supply is connected to the second test point.

2. The method according to claim 1, wherein the adjusting step comprises:
   continuously increasing the input voltage of the external repair power supply, so that display brightness of an area corresponding to the short circuited line rises continuously; and
   when the display brightness of the area stops rising and falls back to be equal to display brightness of other areas, disconnecting the external repair power supply from the display panel.

3. The method according to claim 2, further comprising:
   placing the repaired display panel in a heating furnace of a preset temperature for a preset time period, so that liquid crystal molecules in the repaired display panel are realigned.

4. The method according to claim 1, wherein before the connecting step, the method further comprises:
   connecting two terminals of a defect detection apparatus to the first test point and the second test point, respectively, so as to detect whether there is the short circuit defect in the line between the first test point and the second test point.

5. The method according to claim 4, wherein the defect detection apparatus comprises an impedance test board and an alarm apparatus electrically connected to the impedance test board, wherein
   the impedance test board is configured to connect its two terminals to the first test point and the second test point, respectively, so as to detect a resistance value between the first test point and the second test point, and the impedance test board is further configured to transmit a prompt signal to the alarm apparatus when the resistance value is less than or equal to a preset resistance value; and
   the alarm apparatus is configured to generate an alarm signal according to the prompt signal, wherein the alarm signal is used to indicate the short circuit defect in the line between the first test point and the second test point.

6. The method according to claim 5, wherein
   the alarm apparatus comprises any of a light-emitting diode, a signal generator and an automated optical inspection.

7. The method according to claim 6, further comprising:
   placing the repaired display panel in a heating furnace of a preset temperature for a preset time period, so that liquid crystal molecules in the repaired display panel are realigned.

8. The method according to claim 5, further comprising:
   connecting the alarm apparatus to a repair line in the display panel; and
   when the alarm apparatus transmits an alarm signal, determining that there is static electricity at the end of the repair line.

9. The method according to claim 8, further comprising:
   placing the repaired display panel in a heating furnace of a preset temperature for a preset time period, so that liquid crystal molecules in the repaired display panel are realigned.

10. The method according to claim 5, further comprising:
    placing the repaired display panel in a heating furnace of a preset temperature for a preset time period, so that liquid crystal molecules in the repaired display panel are realigned.

11. The method according to claim 4, further comprising:
    placing the repaired display panel in a heating furnace of a preset temperature for a preset time period, so that liquid crystal molecules in the repaired display panel are realigned.

12. The method according to claim 1, further comprising:
    placing the repaired display panel in a heating furnace of a preset temperature for a preset time period, so that liquid crystal molecules in the repaired display panel are realigned.

13. The method according to claim 12, wherein
    the preset time period is greater than or equal to 1 hour and less than or equal to 2 hours;
    when no polarizer is disposed in the display panel, the preset temperature is greater than or equal to 120 degrees Celsius and less than or equal to 130 degrees Celsius; and
    when a polarizer is disposed in the display panel, the preset temperature is greater than or equal to 60 degrees Celsius and less than or equal to 70 degrees Celsius.

14. A system for repairing a short circuit defect in a display panel, comprising:
    an external repair power supply having an adjustable voltage, wherein
    the external repair power supply is configured to connect its two terminals to a first test point and a second test point of the display panel having the short circuit defect, respectively, so as to fuse a short circuited line between the first test point and the second test point,
    a defect detection apparatus, wherein the defect detection apparatus is configured to connect its two terminals to the first test point and the second test point in the display panel, respectively, so as to detect whether there is the short circuit defect in the line between the first test point and the second test point, and
    a relay switch, wherein the defect detection apparatus is configured to connect with the external repair power supply in parallel, the parallel connected detect detection apparatus and external repair power supply are then connected in series to the relay switch, and the relay switch is configured to control the defect detection apparatus or the external repair power supply to be connected to the display panel.

* * * * *